(12) United States Patent
Cheng et al.

(10) Patent No.: US 7,989,925 B2
(45) Date of Patent: *Aug. 2, 2011

(54) METHOD FOR FORMING A GROUP III NITRIDE MATERIAL ON A SILICON SUBSTRATE

(75) Inventors: Kai Cheng, Leuven (BE); Maarten Leys, Eindhoven (NL); Stefan Degroote, Scherpenheuven-Zichem (BE)

(73) Assignees: IMEC, Leuven (BE); Katholieke Universiteit Leuven (KUL), Leuven (BE)

( * ) Notice: Subject to any disclaimer, the term of this patent is extended or adjusted under 35 U.S.C. 154(b) by 0 days.

This patent is subject to a terminal disclaimer.

(21) Appl. No.: 12/502,940

(22) Filed: Jul. 14, 2009

(65) Prior Publication Data

US 2009/0294777 A1 Dec. 3, 2009

Related U.S. Application Data

(63) Continuation of application No. 11/690,509, filed on Mar. 23, 2007, now Pat. No. 7,666,765.

(60) Provisional application No. 60/789,861, filed on Apr. 6, 2006.

(30) Foreign Application Priority Data

Jul. 27, 2006 (EP) .................................... 06118018

(51) Int. Cl.
*H01L 21/20* (2006.01)
*H01L 23/58* (2006.01)

(52) U.S. Cl. .............. 257/613; 438/483; 257/E21.09; 257/798; 257/E29.089; 257/E29.068; 257/77; 257/615

(58) Field of Classification Search ............ 257/77, 257/615, E29.089, E29.068, 613, 798, E21.09; 438/483

See application file for complete search history.

(56) References Cited

U.S. PATENT DOCUMENTS

| | | |
|---|---|---|
| 5,861,346 A | 1/1999 | Hamza et al. |
| 6,391,748 B1 | 5/2002 | Temkin et al. |
| 6,811,814 B2 | 11/2004 | Chen et al. |
| 6,818,061 B2 | 11/2004 | Peczalski et al. |
| 2004/0029365 A1 | 2/2004 | Linthicum et al. |
| 2004/0119063 A1 | 6/2004 | Guo et al. |
| 2006/0286782 A1 | 12/2006 | Gaska et al. |
| 2007/0238315 A1 | 10/2007 | Cheng et al. |
| 2008/0067523 A1 | 3/2008 | Dwilinski et al. |

OTHER PUBLICATIONS

Chen et al., "Growth of high quality GaN layers with AlN buffer on Si(111) substrates," Journal of Crystal Growth 225 (2001) 150-154.
Kang et al., "The growth and characterization of GaN epilayers grown on Si(111) substrates using 3C-SiC intermediate layer," Journal of the Korean Physical Society (Dec. 2001), vol. 39, pp. S70-S73.

*Primary Examiner* — Jami M Valentine
(74) *Attorney, Agent, or Firm* — Knobbe Martens Olson & Bear LLP

(57) ABSTRACT

Semiconductor process technology and devices are provided, including a method for forming a high quality group III nitride layer on a silicon substrate and to a device obtainable therefrom. According to the method, a pre-dosing step is applied to a silicon substrate, wherein the substrate is exposed to at least 0.01 µmol/cm² of one or more organometallic compounds containing Al, in a flow of less than 5 µmol/min. The preferred embodiments are equally related to the semiconductor structure obtained by the method, and to a device comprising said structure.

11 Claims, 10 Drawing Sheets

METHOD FOR FORMING A GROUP III NITRIDE MATERIAL ON A SILICON SUBSTRATE

CROSS-REFERENCE TO RELATED APPLICATIONS

This application is a continuation of U.S. application Ser. No. 11/690,509, filed Mar. 23, 2007, which claims the benefit under 35 U.S.C. §119(e) of U.S. Provisional Application No. 60/789,861, filed Apr. 6, 2006, and which also claims the benefit under 35 U.S.C. §119(a)-(d) of European application No. 06118018.8, filed Jul. 27, 2006, the disclosures of which are hereby expressly incorporated by reference in their entirety and are hereby expressly made a portion of this application.

FIELD OF THE INVENTION

The preferred embodiments relate to semiconductor process technology and devices. In particular, the preferred embodiments relate to a method for forming a high quality group III nitride layer on a silicon substrate and to a semiconductor structure obtained therefrom.

BACKGROUND OF THE INVENTION

Wide bandgap semiconductors, including SiC, AlN and GaN related materials, have attracted much interest lately. In order to obtain high-quality GaN or SiC layers on Si, a growth method with different steps is used to accommodate for the large lattice and thermal mismatch between GaN and Si. AlGaN layers have been successfully used over the last years as templates for the growth of GaN on Si.

The use of an AlN buffer layer between the silicon substrate and the GaN layer is known in the prior art.

U.S. Publication No. US-2004/0119063-A1 describes a device wherein a few monolayers of aluminum are deposited on the silicon substrate to protect the silicon substrate from ammonia and then forming a nucleation layer of AlN and a buffer structure including multiple superlattices of AlGaN semiconductor having different compositions and an intermediate layer of GaN or another Ga-rich nitride semiconductor. This results in an improved crystalline structure.

On the other hand, various hydrocarbons have been applied to carbonize the silicon surface, however this requires a much higher substrate temperature and results in a rough interface between SiC and the Si surface prior to the formation of AlN. Furthermore, this method is not convenient since it requires ex situ processing steps. For example, in U.S. Publication No. US-2004/0029365-A1, a Si surface is heated and contacted by a flow of ethylene, to form a SiC layer of 50 Å (5 nm), after which a 3C—SiC layer is formed by epitaxial growth, and preferably thinned (e.g. to 5 µm) to form a platform for AlN formation. The 3C—SiC layer may also be formed directly on the Si-surface. The SiC layer formed by contacting with the ethylene flow is an example of the abovementioned layers having a bad interface with the Si-surface. For this reason, this SiC layer is not suitable for direct formation of AlN.

SUMMARY OF THE INVENTION

The preferred embodiments provide an improved method for growing AlN on a silicon substrate.

Further, the preferred embodiments provide an improved method for growing a wide bandgap material, such as group III nitride material, on silicon.

Further, the preferred embodiments provide an improved method for growing SiC on a silicon substrate.

The preferred embodiments provide a method for forming, in situ, a group III nitride layer on an intermediate layer comprising at least one area consisting of SiC throughout the thickness of the area, the method, comprising the steps of:
a) providing a Si substrate in a reactor,
b) providing at least 0.01 µmol/cm² of one or more organometallic compounds containing Al, in a flow of less than 5 µmol/min, preferably less than 1 µmol/min, more preferably less than 0.2 µmol/min, even more preferably less than 0.1 µmol/min (but not null (0 µmol/min)), thereby forming the intermediate layer, and
c) providing the precursors suitable for forming a group III nitride layer.

The preferred embodiments also provide a method for forming, in situ, a SiC layer on an intermediate layer comprising at least one area consisting of SiC throughout the thickness of the area, the method comprising the steps of:
a) providing a Si substrate in a reactor,
b) providing at least 0.01 µmol/cm² of one or more organometallic compounds containing Al, in a flow of less than 5 µmol/min, preferably less than 1 µmol/min, more preferably less than 0.2 µmol/min, even more preferably less than 0.1 µmol/min (but not null), thereby forming the intermediate layer, and
c) providing the precursors suitable for continuing forming a SiC layer.

According to one preferred embodiment, said area of SiC consists of at least one SiC (atomic) monolayer. According to another preferred embodiment, said intermediate layer is a SiC (atomic) monolayer.

Preferably, in a method according to the preferred embodiments, the flow is less than 0.1 µmol/min.

Preferably, in a method according to the preferred embodiments, Al (aluminum) is the metal of said organometallic compound(s) (also referred to as metalorganic compound(s)).

Preferably, said organometallic compound(s) provide(s) methyl or ethyl groups for reacting with said Si substrate.

Preferably, said organometallic compound(s) is/are selected from the group consisting of trimethylaluminum (TMAl), dimethylaluminum hydride (DMAl-H), and triethylaluminum (TEAl).

In a method of the preferred embodiments, said reactor can be a MetalOrganic Chemical Vapor Deposition (MOCVD) reactor (also referred to as a MetalOrganic Vapor Phase Epitaxy (MOVPE) reactor), an Atomic Layer Deposition (ALD) reactor or a Chemical Beam Epitaxy (CBE) reactor.

Preferably, said group III nitride layer or said SiC layer, formed on said SiC monolayer, is an epitaxial layer.

Preferably, said group III nitride layer is an AlN layer.

In a method according to the preferred embodiments, the temperature of the Si substrate is from about 500° C. to about 1400° C., preferably from about 800° C. to about 1400° C., more preferably from about 900° C. to about 1300° C. and even more preferably from about 1000° C. to about 1200° C.

In a method according to the preferred embodiments, the pressure in the reactor is preferably from about 1e-5 mbar to about 1.33 bar.

For MOVPE, the pressure in the reactor is preferably from about 1.33 mbar to about 1.33 bar.

In case of ALD or CBE the pressure is preferably from about 1e-5 mbar to about 1.33 mbar.

A method according to the preferred embodiments can further comprise, after step (c), a step of forming a further group III nitride layer (step (d)). Said further group III nitride layer can consist of a GaN layer, AlGaN layer, InGaN layer, AlInGaN layer or the like.

A method according to the preferred embodiments can be used for manufacturing semiconductor devices such as a Field Effect Transistor (FET) device (such as a High Electron Mobility Transistor (HEMT) device), a Light Emitting Diode (LED), a UV sensor, or a solar cell, etc.

The preferred embodiments are also related to a semiconductor structure comprising
  a Si substrate,
  on said Si-substrate, an intermediate layer comprising at least one area consisting of SiC throughout the thickness of the area, said area having a thickness of max. 2 nm,
  On said intermediate layer, a group III nitride layer or a SiC layer, said group III nitride layer or said SiC layer having a value 'full width at half maximum' (FWHM) lower than 1000 arc sec.

In the structure of the preferred embodiments, said intermediate layer may be a SiC layer. The intermediate layer may be a layer comprising one or more areas of SiC and one or more areas of SiN. Said SiC areas may have a thickness of max. 1 nm.

According to a preferred embodiment, said SiC areas may be (atomic) monolayers of SiC.

Said group III nitride may be selected from the group consisting of AlN, GaN, AlGaN, InGaN and AlInGaN.

The structure may further comprise on said group III nitride layer or on said SiC layer a further group III nitride layer. Said further group III nitride layer may have a value 'full width at half maximum' lower than 500 arc sec. Said further group III nitride may be selected from the group consisting of AlN, GaN, AlGaN, InGaN and AlInGaN.

The preferred embodiments are equally related to a semiconductor device obtainable by the method of the preferred embodiments.

The preferred embodiments are equally related to a semiconductor device comprising a structure according to the preferred embodiments. This device can be a Field Effect Transistor (FET) device (such as a High Electron Mobility Transistor (HEMT) device), a Light Emitting Diode (LED), a UV sensor, or a solar cell, etc.

DETAILED DESCRIPTION OF THE PREFERRED EMBODIMENT

Figure 1:
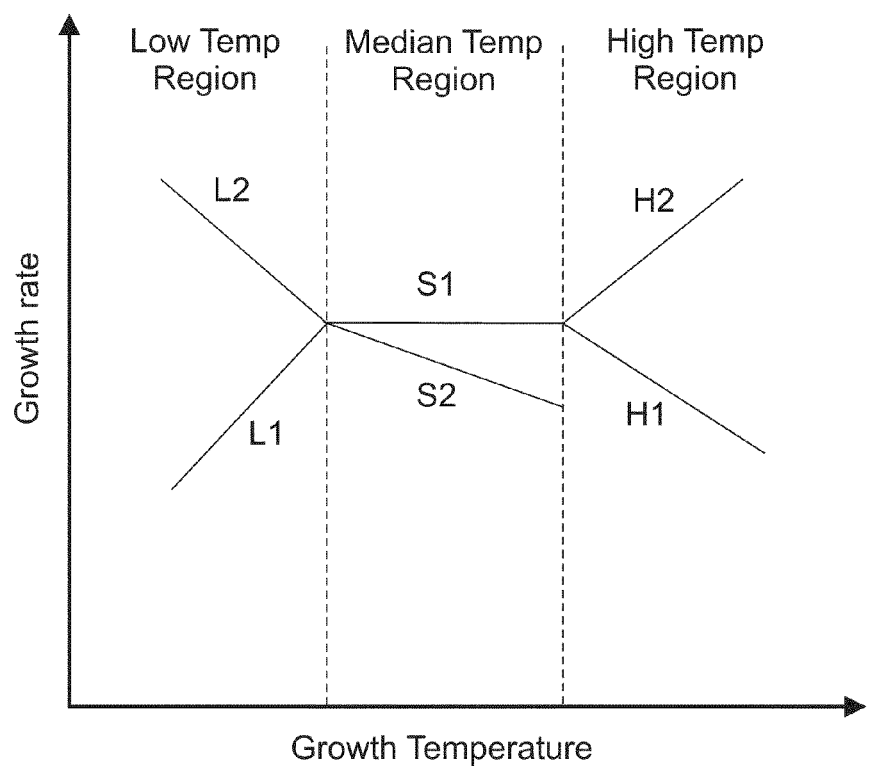
FIG. 1 represents a schematic overview of the different temperature regions for ALD growth. The growth rate is plot as a function of the growth temperature.

The present invention will be described with respect to particular embodiments and with reference to certain drawings.

The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The preferred embodiments are based on the surprising discovery that a SiC (silicon carbide) atomic monolayer is formed on a Si (silicon) substrate when an organometallic compound containing aluminum is provided at an ultra low flow in the reactor.

It appears that the presence of said SiC monolayer is particularly suited for growing a group III nitride layer, more particularly an AlN layer.

Moreover, said SiC monolayer can prevent Si diffusion and can also protect the Si substrate from nitridation and can introduce compressive stress in the AlN.

The preferred embodiments provide a method for forming, in situ, a group III nitride layer on an intermediate layer comprising at least one area consisting of SiC throughout the thickness of the area, the method comprising the steps of:
  a) providing a Si substrate in a reactor,
  b) providing at least 0.01 μmol/cm² of one or more organometallic compounds containing Al, in a flow of less than 5 μmol/min, preferably less than 1 μmol/min, more preferably less than 0.2 μmol/min, even more preferably less than 0.1 μmol/min (but not null), and
  c) providing the precursors suitable for forming a group III nitride layer.

More particularly, the preferred embodiments provide a method for forming, in situ, a group III nitride layer on an intermediate layer comprising at least one area consisting of SiC throughout the thickness of the area, the method comprising the steps of:
  a) providing a Si substrate in a reactor,
  b) providing at least one organometallic compound wherein the metal is Al, in a flow of less than 5 μmol/min, and then
  c) providing the precursors suitable for forming a group III nitride layer upon said SiC monolayer.

In the above, step b) results in the intermediate layer. According to one preferred embodiment, the intermediate layer consists of one (atomic) SiC layer, over the whole area of the substrate. The intermediate layer can also consist of a stack of several SiC monolayers (typically 2 or 3) on top of each other, over the whole area of the substrate. This number of monolayers can be uniform over the whole area of the substrate or can vary over the area of the substrate. Another preferred embodiment has an intermediate layer with areas of SiC (throughout the thickness), adjacent to areas of SiN (throughout the thickness). The reason for the presence of SiN is explained further. Also in the latter case, the areas of SiC may consist of one SiC monolayer, or of a stack of SiC monolayers on top of each other.

The number of monolayers comprised in the intermediate layer or in the SiC areas of the intermediate layer may depend on the period during which step b) is performed.

In any case, according to the preferred embodiments, the group III nitride layer is provided on top of a SiC monolayer, be it a single SiC monolayer, or the top monolayer of a stack of monolayers. Also when a SiC monolayer is not present on the whole area of the substrate (i.e. when areas of SiN are present), the production of the group III nitride layer or the additional SiC layer yields these layers with the claimed quality in terms of FWHM.

Preferably, in a method according to the preferred embodiments, said organometallic compound(s) is/are provided to reach a total of at least about 0.007 µmol, preferably of at least about 0.008 µmol, more preferably of at least about 0.009 µmol, and even more preferably of at least about 0.01 µmol, for a Si substrate surface of about 1 cm$^2$, whereby the surface is covered to form an atomic monolayer.

Moreover, said organometallic compound(s) is/are provided by a flow of less than about 5 µmol/min, preferably less than about 1 µmol/min, more preferably less than about 0.5 µmol/min, or less than about 0.2 µmol/min, even more preferably less than about 0.1 µmol/min (but not null (0 µmol/min)).

Preferably, said flow is from about 5 µmol/min to about 0.005 µmol/min, more preferably from about 2 µmol/min to about 0.01 µmol/min, even more preferably from about 0.5 µmol/min to about 0.03 µmol/min, and even more preferably from about 0.1 µmol/min to about 0.05 µmol/min.

In the context of the preferred embodiments, said flow of less than 5 µmol/min, preferably less than about 1 µmol/min, more preferably less than about 0.5 µmol/min, or less than about 0.2 µmol/min, even more preferably less than about 0.1 µmol/min (but not null (0 µmol/min)), is also referred to as ultra-low flow or ultra-low dose.

In the context of the preferred embodiments, the step (b) of providing said organometallic compounds can be referred to as the "predosing step".

Preferably, said organometallic compound(s) decompose(s) and provide(s) methyl or ethyl groups. Said organometallic compound(s) can be selected from the group consisting of trimethylaluminum (TMAl), DMAl-H, and triethylaluminum (TEAl).

Said organometallic compound(s) is/are introduced in its/their gaseous form or in a gaseous composition.

In particular, said organometallic compound(s) can be diluted in $N_2$, or in any noble gas (such as He, or Ar), and preferably in $H_2$ gas.

In other words, said composition can consist of $H_2$ and at least one organometallic compound containing Al. More preferably, said composition consists of $H_2$ and one organometallic compound wherein the metal is Al.

Said gaseous composition can further comprise traces of nitrogen (whether intentional or not) which can react with the Si substrate for forming SiN, resulting in a substrate partially covered with SiC and partially covered with SiN, with mutually adjacent areas of SiC and SiN. Also, it is possible that SiN is already present as a contaminant on parts of the substrate before the pre-dosing step. In that case, the pre-dosing step deposits SiC in between those SiN areas and the final result is an intermediate layer comprising areas of SiC adjacent to areas of SiN. The SiC areas can consist of one SiC (atomic) monolayer or of a stack of several, typically two or three (atomic) SiC monolayers. There may also be a variation in the number of monolayers over the SiC area.

It is understood by the skilled person that the expressions 'SiN' is not limited to the compound that is strictly defined by the stoichiometric ratio of the chemical formula for silicon nitride, which is $Si_3N_4$. In a layer of SiN, a deviation from the stoichiometric ratio of 3/4 may be present, i.e. a variation of 20 to 30% of the values of 3 and 4 can be observed. This may depend on process parameters such as deposition temperature and gas flows during deposition. It is in the light of these observations that the expressions 'SiN' is to be understood and interpreted in the present description.

Whereas SiN is amorphous, SiC shows a crystalline structure. 'SiC' or silicon carbide has a stoichiometric composition, i.e. $Si_1C_1$. This crystalline structure of the SiC improves the quality of the group III nitrides grown on top of the combined SiC/SiN layer.

A method of the preferred embodiments can be carried out in an ALD reactor or a CBE reactor, and preferably in a MOVPE reactor.

Usually, in a MOVPE reactor, the precursors are introduced at the same time. In the preferred embodiments, the precursors are supplied alternatively (i.e. consecutively, or successively).

Said group III nitride layer of step (c) can comprise or consist of AlN, GaN, AlGaN, InGaN, or AlInGaN.

Preferably, said group III nitride layer of step (c) is an AlN layer.

Preferably, an epitaxial layer is formed on said intermediate layer.

An excellent crystalline quality can be achieved by carrying out a method according to the preferred embodiments.

Indeed, for the first time, and for a film thickness of less than 10 µm, AlN layers exhibiting a FWHM of about 800 arc sec. and GaN layers exhibiting a FWHM of less than 300 arc sec. could be obtained. For group III nitride layers a FWHM below 1000 arc sec should be possible, even better below 800 arc sec, or even better below 500 arc sec.

In the context of the preferred embodiments, FWHM refers to the full width at half maximum measured in accordance with standard methods for determining crystal quality, such as an X-ray rocking curve (0002) omega scan method.

In a method according to the preferred embodiments, the temperature of the Si substrate is preferably from about 500° C. to about 1400° C., preferably from about 800° C. to about 1400° C., more preferably from about 900° C. to about 1300° C. and even more preferably from about 1000° C. to about 1200° C.

The pressure in the reactor is preferably from about 1e-5 mbar to about 1.33 bar. In particular, for MOVPE the pressure is preferably from about 1.33 mbar to about 1.33 bar; and for CBE or ALD, the pressure is preferably from about 1e-5 mbar to about 1.33 mbar.

A further group III nitride layer can be deposited on the layer formed in step (c). Said further group III nitride layer preferably comprises or consists of a GaN layer, AlGaN layer, InGaN layer, AlInGaN layer or the like. Accordingly, a method according to the preferred embodiments can further comprise, after step (c), a step (d) of forming said further group III nitride layer. For this further group III nitride layer it is possible to achieve a FWHM below about 1000 arc sec, even better below about 800 arc sec, or even better below about 500 arc sec.

A method for growing (forming) a SiC layer upon a SiC monolayer is also provided. Said method also comprises the step (a) of providing a Si substrate, the step (b) of providing at least one organometallic compound which contains Al (preferably one or more organometallic compounds wherein the metal is Al), and the step (c), wherein in step (c), suitable precursors for forming said SiC layer is provided, whereby a SiC layer continues growing (upon said SiC monolayer).

In other words, said method for growing a SiC layer is a method according to the preferred embodiments wherein, instead of providing group III nitride layer precursors, suitable SiC layer precursors are provided in step (c). For SiC on this intermediate layer it is possible to achieve a FWHM below about 1000 arc sec, even better below about 500 arc sec.

Except for the precursors, the same features and conditions apply.

A method according to the preferred embodiments can be used for manufacturing semiconductor devices such as a Field Effect Transistor (FET) device (such as a High Electron Mobility Transistor (HEMT) device), a Light Emitting Diode (LED), a UV sensor, or a solar cell, etc.

In the preferred embodiments, SiC can be grown on silicon at high temperature (~1100° C.) in self-limiting region (self-limiting conditions) by MOVPE.

In MOVPE, group-III nitrides are normally grown in mass-transport-limiting region/conditions and the growth rate of epitaxial films is determined by the flux of precursors. When compound semiconductors are grown in MOVPE reactor, two or more precursors are introduced to the reactor at the same time.

In a method according to the preferred embodiments, the organometallic compounds (e.g. TMAl) are first introduced in the reactor. MOVPE is carried out in self-limiting region/conditions by providing ultra-low dose of said organometallic compounds (e.g. TMAl).

According to a preferred embodiment, said organometallic compound is trimethylaluminum (TMAl).

The silicon surface is carbonized (or passivated) by methyl groups decomposed from TMAl, since one SiC monolayer or less than a monolayer (e.g., when the surface is partially covered by SiN) can be observed, grown in self-limiting region/conditions. To the contrary, no accumulation of aluminum atoms on the silicon substrate is observed.

An AlN layer is formed by providing Al precursors (e.g. TMAl) and nitrogen precursors (e.g. ammonia or hydrazine).

Wide bandgap semiconductors can then be grown.

It is to be noted that self-limiting growth was first used in ALD method.

Referring to FIG. 1, three temperature regions are represented: low temperature region, median temperature region and high temperature region.

In the low temperature region the heterogeneous reaction rate is too slow (L1), or in case of multi-layer adsorption (L2), self-limiting conditions are not reached.

In the high temperature region, the reaction can be dominated by precursor decomposition, as shown by curve H2; or dominated by precursor desorption, as shown by curve H1.

In the median temperature region, self-limiting reaction/conditions (S1, S2) is/are achieved.

Figure 2:
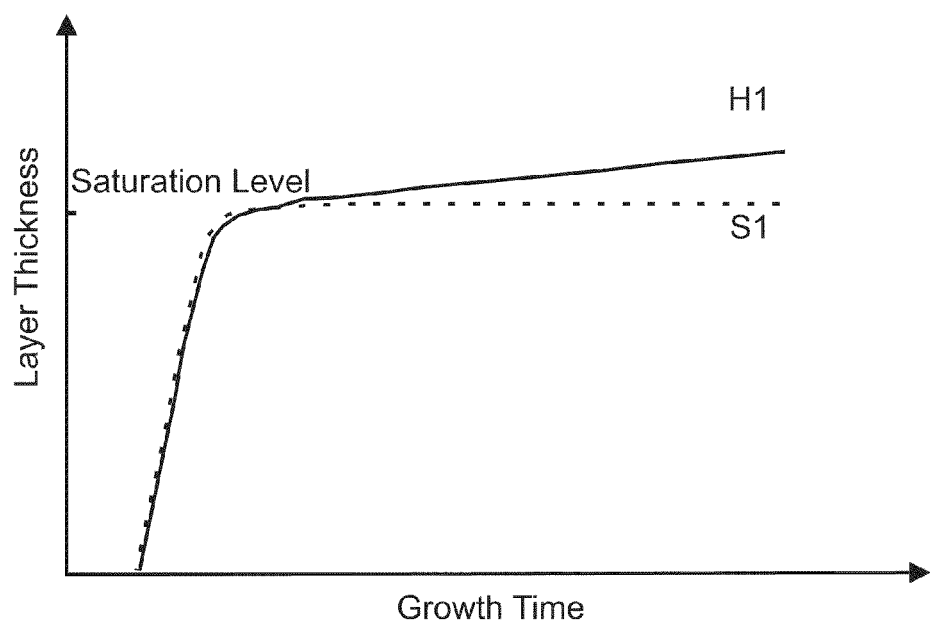
FIG. 2 represents a schematic overview of the layer thickness evolution in time for the specific conditions H1 and S1 as shown in FIG. 1.

FIG. 2 shows that in the self-limiting region/conditions, the as-grown thickness has a saturation level and cannot increase further by prolonging the growth time.

This FIG. 2 shows also that a thicker layer can be observed in H1 case.

The decomposition temperature of TMAl is about 260° C. and the growth temperature of group-III Nitride materials is normally beyond 1000° C.

From the classical point of view, group-III nitrides are not grown in self-limiting region/conditions. And at high temperature, both precursor decomposition rate and desorption rate are enhanced. TMAl is decomposed to methyl groups and Aluminum atoms at high temperature as follows:

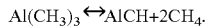
$Al(CH_3)_3 \leftrightarrow AlCH + 2CH_4$.

Then, methyl groups and Al atoms are bound to the surface of silicon substrate. Meanwhile, desorption also occurs. Al atoms may diffuse into the silicon substrates or be evaporated back to the carrier gas.

A possible explanation of the mode of action of preferred embodiments is that: by providing an ultra-low flow of precursors, equilibrium between decomposition and desorption is achieved and thus no aluminum atoms are accumulated on the surface, because the bond between methyl groups and silicon atoms is stronger. Finally the silicon surface is carbonized (and consequently passivated) by the methyl groups.

Said ultra-low TMAl dose is introduced into the reactor prior to the actual growth of AlN.

Methyl, resulting from the decomposition of the metalorganic compounds, is used to carbonize the Si substrate.

A SiC/Si(111) template obtained by carrying out a method of the preferred embodiments appears to be very suitable for further growth of AlN with very high epitaxial quality and low stress.

Possible precursors for the forming of group-III nitride layers are ammonia ($NH_3$) and all compounds which contain a metal from group three (III) in the periodic system of the elements with as ligand (side group) an alkyl, so a group containing carbon and hydrogen. Also side groups of amine (Nitrogen and hydrogen) are possible. At least one of the ligands should be methyl ($CH_3$), ethyl ($C_2H_5$) or propyl ($C_3H_7$) in order to be able to donate carbon to the silicon surface.

Precursors for the formation of SiC are usually silane ($SiH_4$) (but di-and tri-silane ($Si_2H_6$, $Si_3H_8$) are in theory also possible) as source of Si. As source of C one can use alkanes and alkenes, e.g., methane ($CH_4$), ethane ($C_2H_6$), propane ($C_3H_8$), butane ($C_4H_{10}$), $C_2H_4$, and $C_2H_2$.

The preferred embodiments also provide a device, such as a FET device, a LED, a UV sensor, or a solar cell, comprising a semiconductor structure obtained by the method of the preferred embodiments.

Said structure obtained by the method according to the preferred embodiments is characterized by the presence, between the Si substrate and the layer formed in step (c), of an intermediate layer comprising at least one area consisting of SiC throughout the thickness of said area, said area having a thickness of max. 2 nm, preferably max. 1 nm. The intermediate layer can be a SiC layer or a layer consisting of areas of SiC and SiN adjacent to each other. The intermediate layer can be a SiC (atomic) monolayer. It can comprise areas of a SiC (atomic) monolayer adjacent to areas of SiN.

In particular, one preferred embodiment of a semiconductor structure comprises
  a Si substrate
  on said substrate, an intermediate layer comprising at least one area consisting of SiC throughout the thickness of the area, said area having a thickness of max. 2 nm,
  on said intermediate layer, a group III nitride layer with a value 'full width at half maximum' (FWHM) lower than 1000 arc sec.

According to a second preferred embodiment, the semiconductor structure comprises
a Si substrate,
on said substrate, an intermediate layer comprising at least one area consisting of SiC throughout the thickness of the area, said area having a thickness of max. 2 nm,
on said intermediate layer, a SiC layer with a value 'full width at half maximum' (FWHM) lower than 1000 arc sec, or preferably lower than 500 arc sec.

The intermediate layer is a SiC layer or a layer comprising SiC and SiN, produced by the method of the preferred embodiments, e.g., by using a low flow rate of an Al-containing metalorganic. Only the method of the preferred embodiments is capable of producing a semiconductor structure with the combined features of a low thickness intermediate layer, and a group III nitride or SiC layer with the abovementioned crystal structure quality.

The group III nitride layer can be selected from the group consisting of AlN, GaN, AlGaN, InGaN and AlInGaN.

On top of the group III nitride layer or on top of the SiC layer, a further group III nitride layer may be present. Said further group III nitride may be selected from the group consisting of AlN, GaN, AlGaN, InGaN and AlInGaN.

The semiconductor structure of the preferred embodiments is characterized by the high quality of the crystal grown upon said SiC or SiC/SiN intermediate layer (e.g. monolayer). More particularly, an epitaxially grown group III nitride layer (e.g. AlN layer) exhibits a FWHM of less than about 1000 arc sec., preferably of less than about 950 arc sec., more preferably of less than about 900 arc sec., even more preferably of less than about 850 arc sec, and even more preferably of about 800 arc sec. SiC grown on the intermediate SiC or SiC/SiN layer exhibits a FWHM of less than about 1000 arc sec., preferably of less than about 500 arc sec, less than about 450 arc sec., preferably of less than about 400 arc sec., more preferably of less than about 350 arc sec., even more preferably of less than about 300 arc sec.

Similarly, an epitaxially grown further group III nitride layer, i.e. grown on top of the first nitride layer or SiC layer which is itself grown on top of the intermediate layer (e.g. a GaN layer, grown on top of AlN), exhibits a FWHM of less than about 500 arc sec, less than 450 arc sec., preferably of less than about 400 arc sec., more preferably of less than about 350 arc sec., even more preferably of less than about 300 arc sec.

The preferred embodiments are described in further details in the following examples, which are intended for illustration purposes only, and should not be construed as limiting the scope of the invention in any way.

EXAMPLE 1

Figure 3:
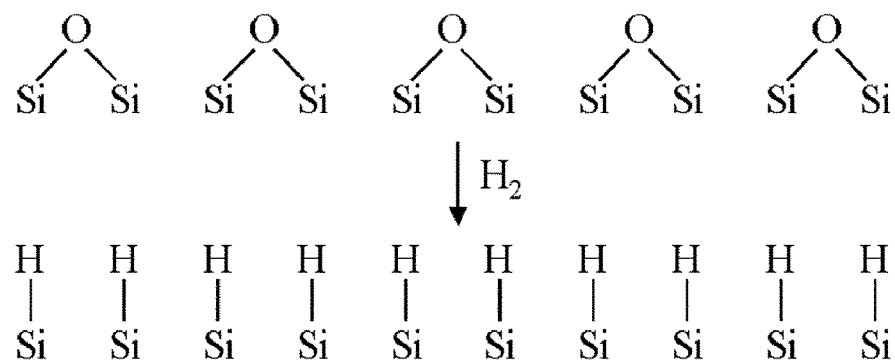
FIG. 3 represents a schematic illustration of $SiO_2$ etched in $H_2$ ambient resulting in H-terminated surface.

In a first step, silicon wafers are chemically cleaned prior to loading into the Vertical 3×2" Close Coupled Showerhead (CCS) MOVPE reactor. The substrates are annealed at 1100° C. in $H_2$ for 10 min, resulting in an H-terminated Silicon surface (FIG. 3).

Due to the decomposition of GaN and AlGaN alloy deposited (during prior uses) on the susceptor and the liner, the hydrogen-terminated surface can also be partially nitridated.

Figure 4:
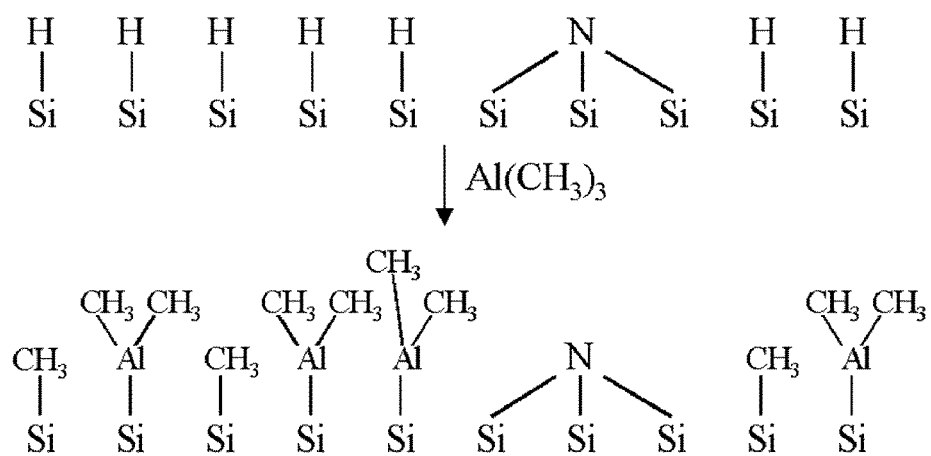
FIG. 4 represents a schematic illustration of the surface reaction of TMAl on the H-terminated silicon surface.
Figure 5:
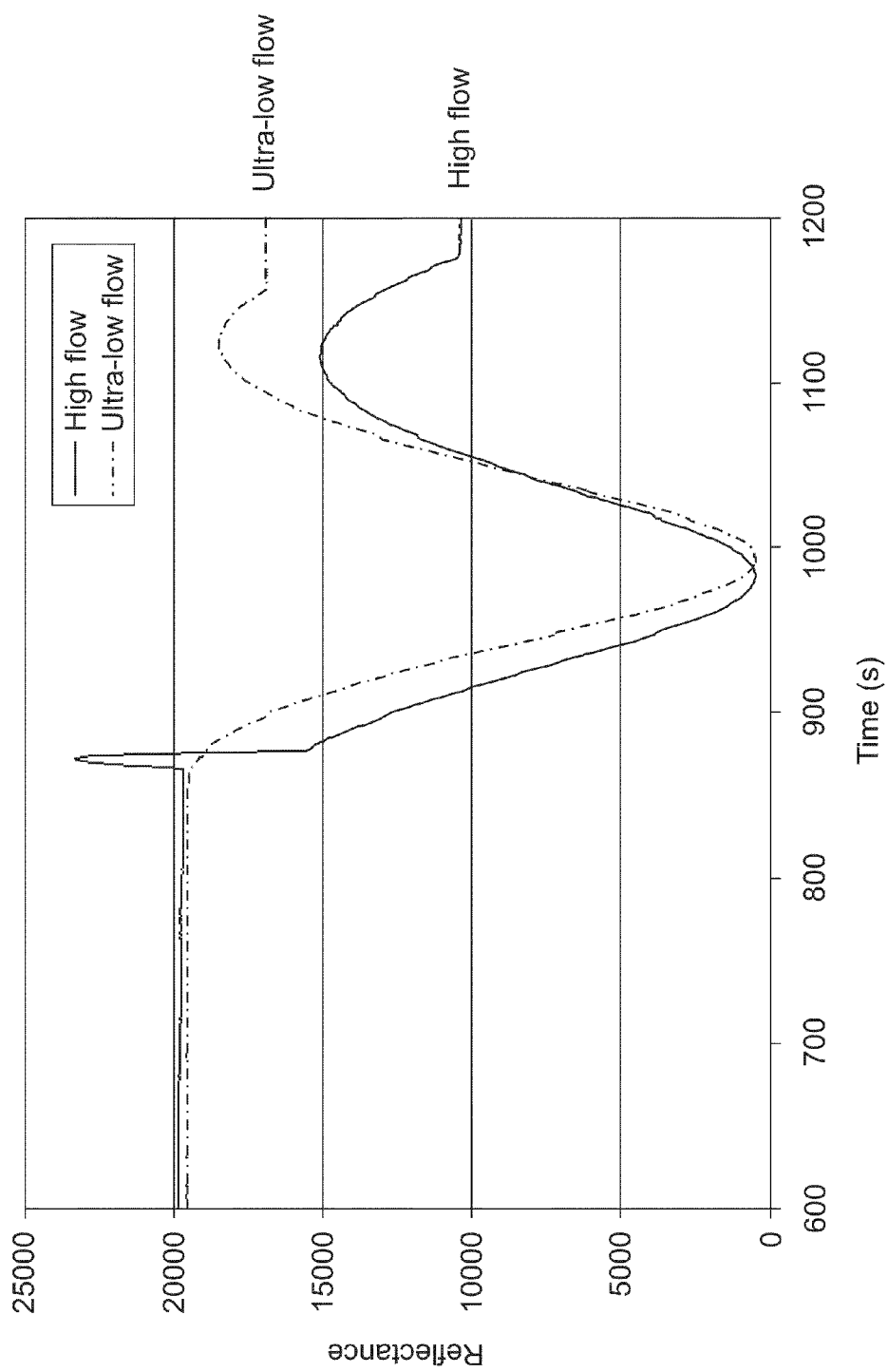
FIG. 5 represents Real-time reflectance curve of AlN growth with high or ultra-low flow TMAl predosing from the in situ interferometer.

Then TMAl is introduced into the MOVPE reactor. The flow of TMAl is ultra-low, about 0.07 μmol/min. At 1100° C., TMAl is decomposed in the $H_2$ ambient as: $Al(CH_3)_3 \leftrightarrow AlCH+2CH_4$, and the decomposed TMAl can react with hydrogen-terminated surface (FIG. 4).

SiC is formed on the silicon surface by a reaction between a methyl group and silicon. Aluminum is considered to play the role of a catalyst by lowering the energy barrier for the carbonization reaction.

The silicon substrates are exposed to the ultra-low flow for 180 sec., resulting in one monolayer of SiC formation on the silicon substrates.

Then, the flow of TMAl is raised to a standard of 27.3 μmol/min and $NH_3$ is provided in a flow of 100 sccm, resulting in a ~180 nm AlN layer, grown on SiC/Si(111) templates.

Good quality of AlN with low growth stress is achieved.

EXAMPLE 2

An in situ real-time reflectance monitoring system is installed in the reactor (the same as in Example 1).

When TMAl is provided within a standard flow (i.e. about 25 to 30 μmol/min for the reactor used) accumulation of aluminum atoms on the silicon substrate is observed from increasing reflectance.

On the other hand, when working in self-limiting region/conditions, no change in reflectance can be seen.

Figure 6:
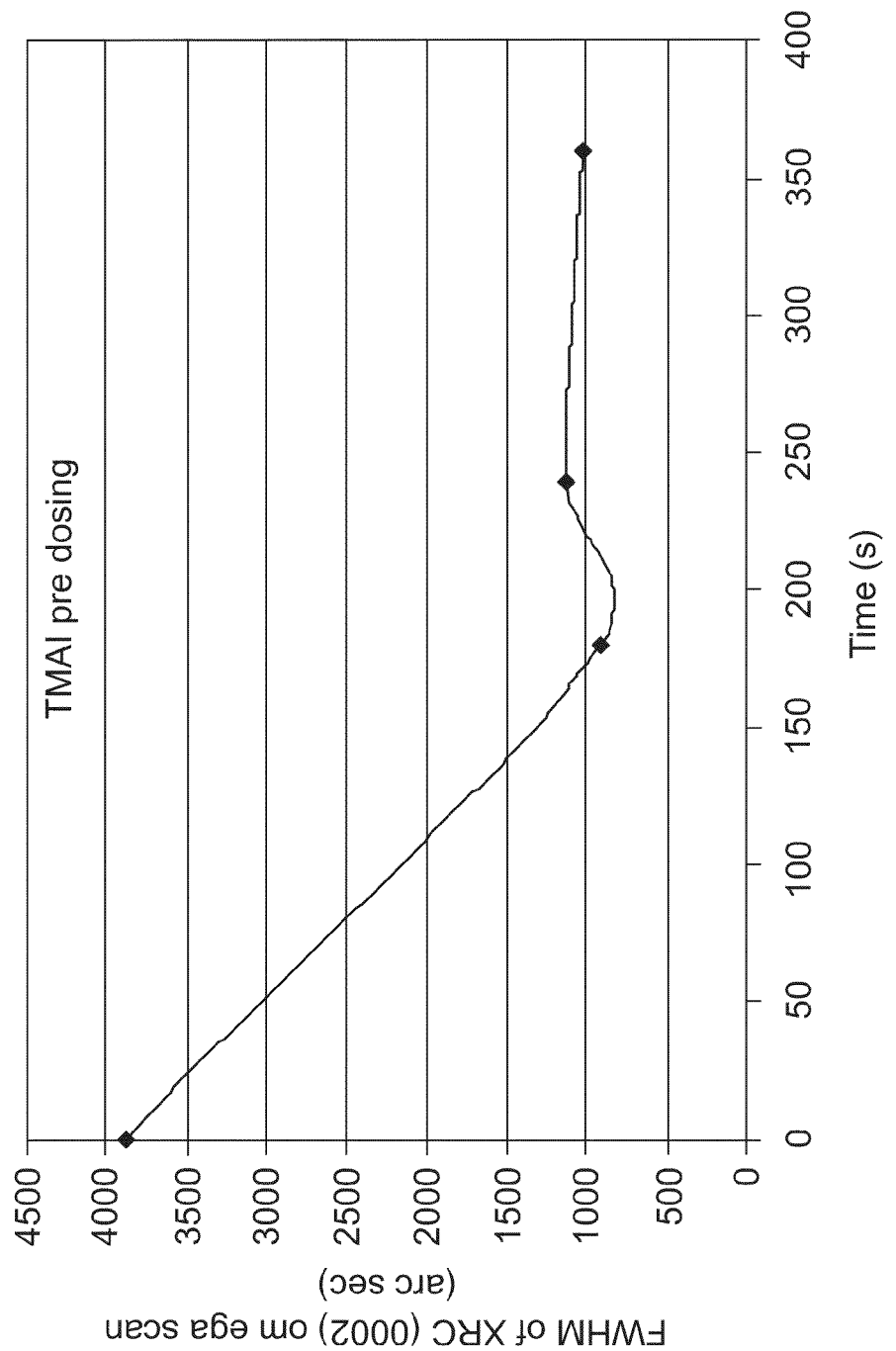
FIG. 6 represents the crystalline quality of as-grown AlN layers as a function of TMAl predosing time. A saturation predosing time is observed at about 180 s.

The graphs of FIG. 6 illustrate the quality in a 180 nm thick AlN layer grown on Si versus the TMAl predosing time.

For 180 nm AlN, the omega scan FWHM is between 800 arc sec and 1500 arc sec.

A minimum in both FWHM can be found for a predosing time of 180 sec.

For a predosing time of 0 sec, (i.e. no predosing), the FWHM is a factor 4 higher than for the optimized predosing time.

Figure 7:
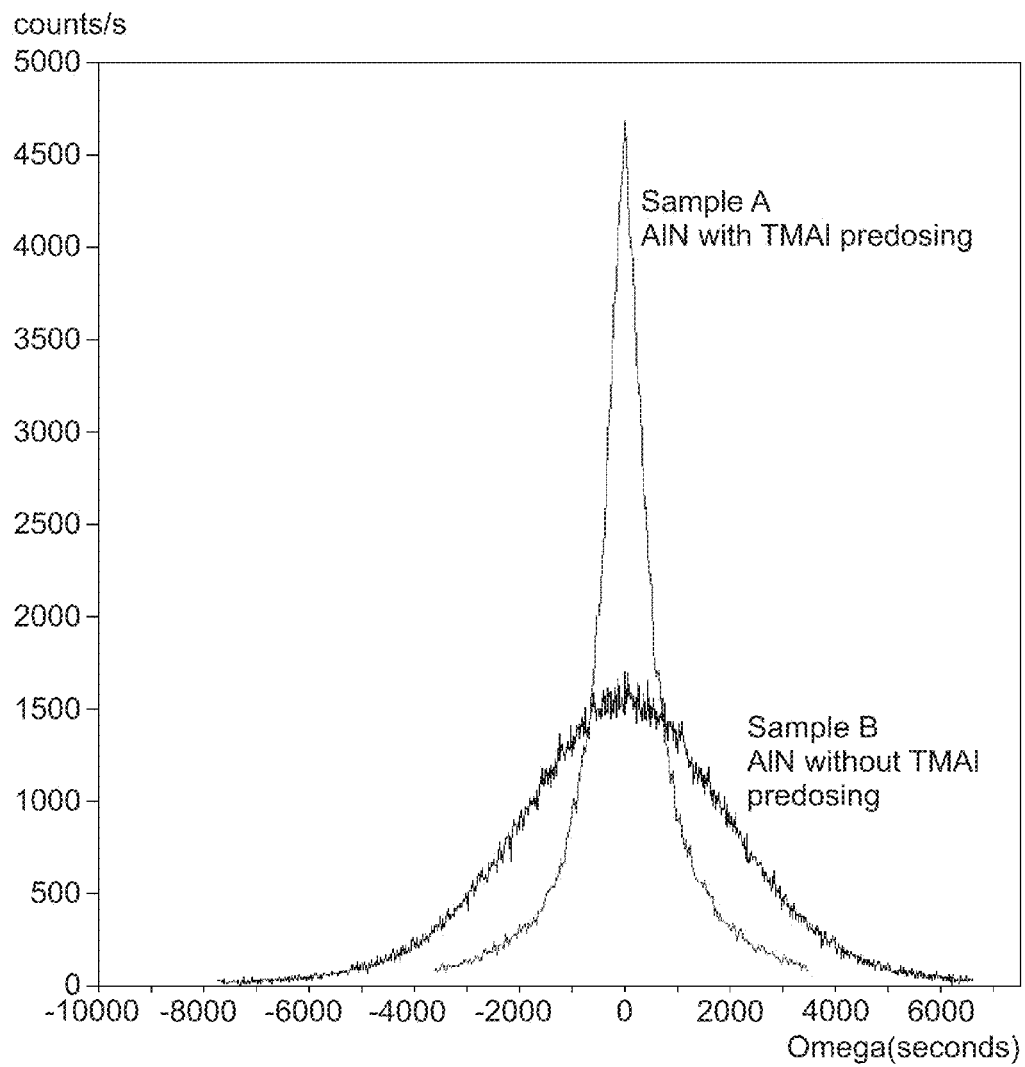
FIG. 7 represents a HR-XRD symmetry (0002) omega-scan of Sample A (with TMAl predosing) and Sample B (without TMAl predosing). The FWHM of Sample A is 853 arc sec while the FWHM of Sample B is 3891 arc sec.

The FIG. 7 gives the HR-XRD (0002) omega-scan of samples with and without TMAl predosing.

The FWHM of sample with TMAl predosing is as narrow as 853 arc sec while the FWHM of sample without TMAl predosing is larger than 3600 arc sec (or higher than 1 degree).

RBS/Channeling measurements on both samples grown with and without predosing also reveal an improvement in crystalline quality for the first type of samples.

Figure 8A:
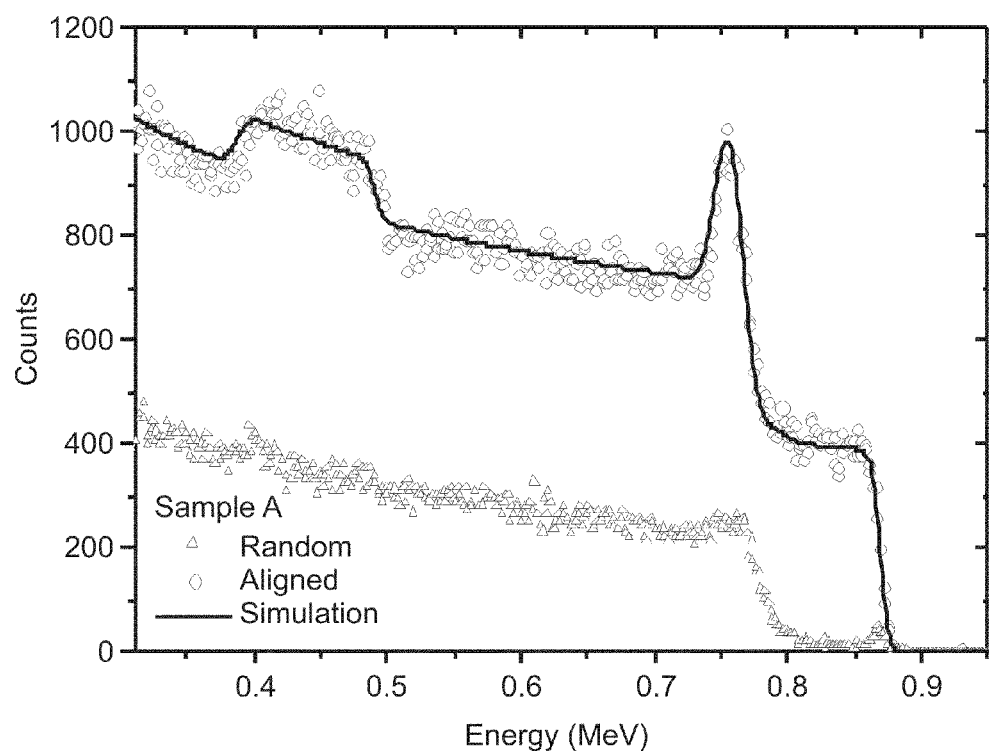
FIG. 8 represents a RBS/Channeling spectrum of Sample A (a) and Sample B (b). $\chi_{min}$ from the AlN layer of Sample A and Sample B is 3.7% and 15 at respectively.
Figure 8B:
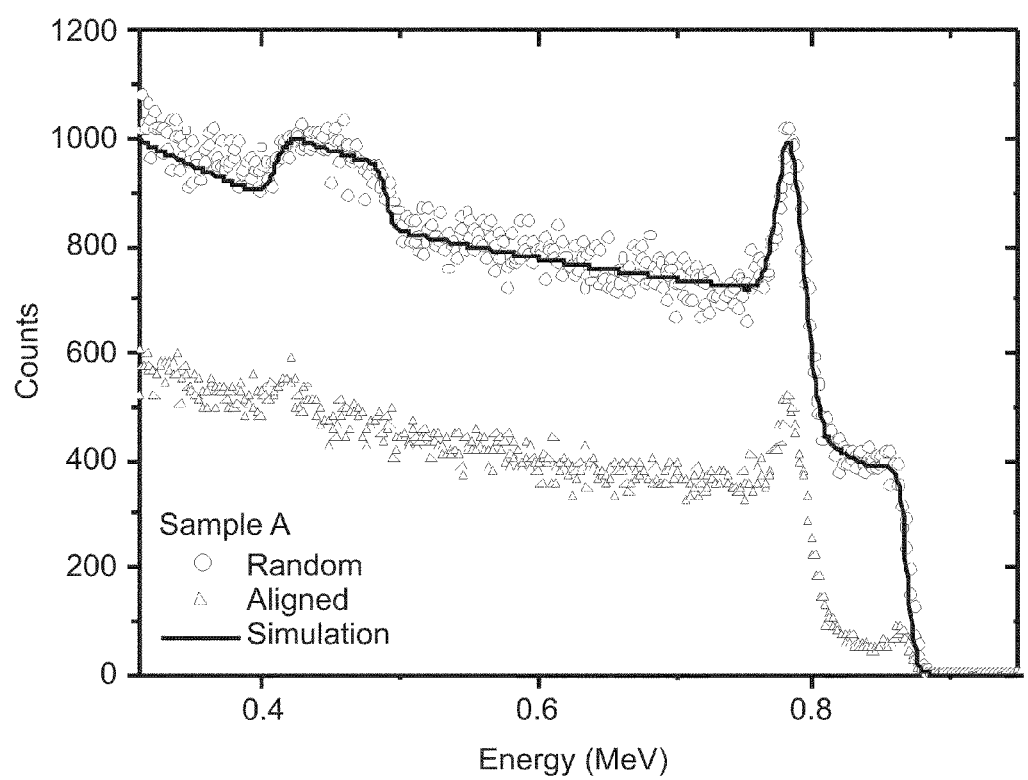

The graph of FIG. 8 shows a random and channeled spectrum for a sample with TMAl predosing.

The minimum backscattering yield ($\chi_{min}$) from the AlN layer and Si substrate respectively is 15% and 51% for samples without predosing and 3.7% and 36% for samples that have been treated with TMAl predosing.

A drastic reduction in $\chi_{min}$ for both the Al and Si signal is observed. The reduction in the Al signal is a result of the improved crystalline quality of the AlN layer, while the reduction of the Si signal suggests a smaller dechanneling effect caused by structural defects at the interface between the substrate and the AlN film.

XPS as well as TEM measurements reveal the presence of an interface layer between the AlN and Si substrate.

Figure 9B:
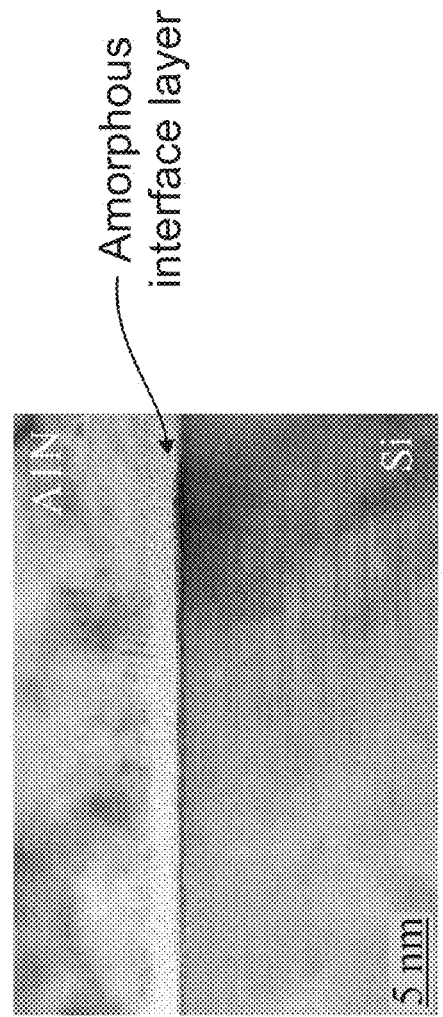
FIG. 9 represents bright-field TEM pictures for samples that have been grown with TMAl predosing (a) and without TMAl predosing (b), along the [11$\bar{2}$0] and [10$\bar{1}$0] zone-axis respectively.
Figure 9A:
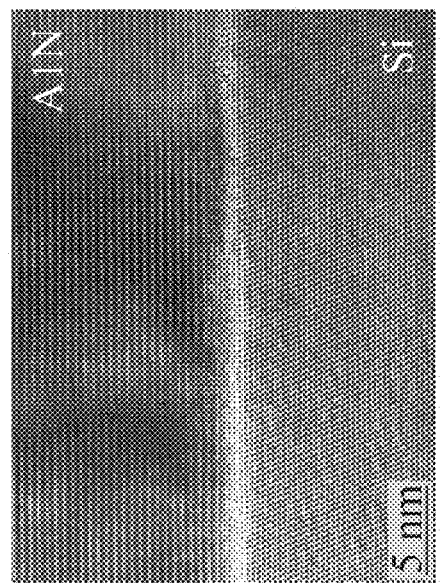

FIG. 9 represents bright-field TEM pictures for a sample that has been grown with TMAl predosing (FIG. 9a) and without TMAl predosing (FIG. 9b), along the [1120] and [1010] zone-axis respectively.

When the substrate is treated with TMAl predosing, the interface layer, equivalent of 2 to 3 mL, is built up out of a mixture of Si, Al, N and C, as can be deduced from a chemical profile perpendicular to the AlN/Si interface.

In XPS measurements, the presence of the C-1s peak from SiC could be clearly identified, next to the C-1s peak coming from the C surface contamination.

Figure 10A:
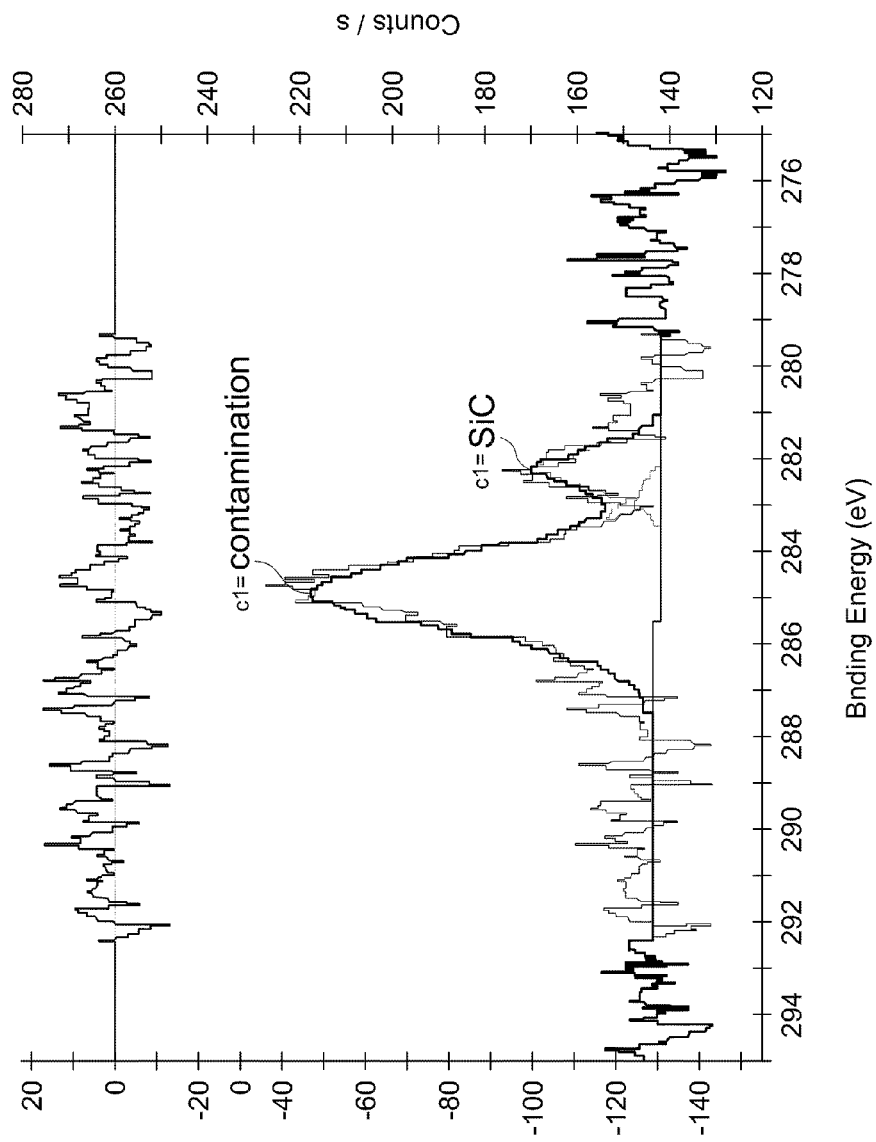
FIG. 10 represents XPS C-1s spectra of Sample A (with TMAl predosing) and Sample B (without TMAl predosing) present in (a) and (b), respectively. In (a) two peaks were observed. The peak at 282 eV is from Si—C bonds while the other peak at 285 eV is from C surface contamination. In (b), only the peak at 285 eV from C surface contamination can be observed.
Figure 10B:
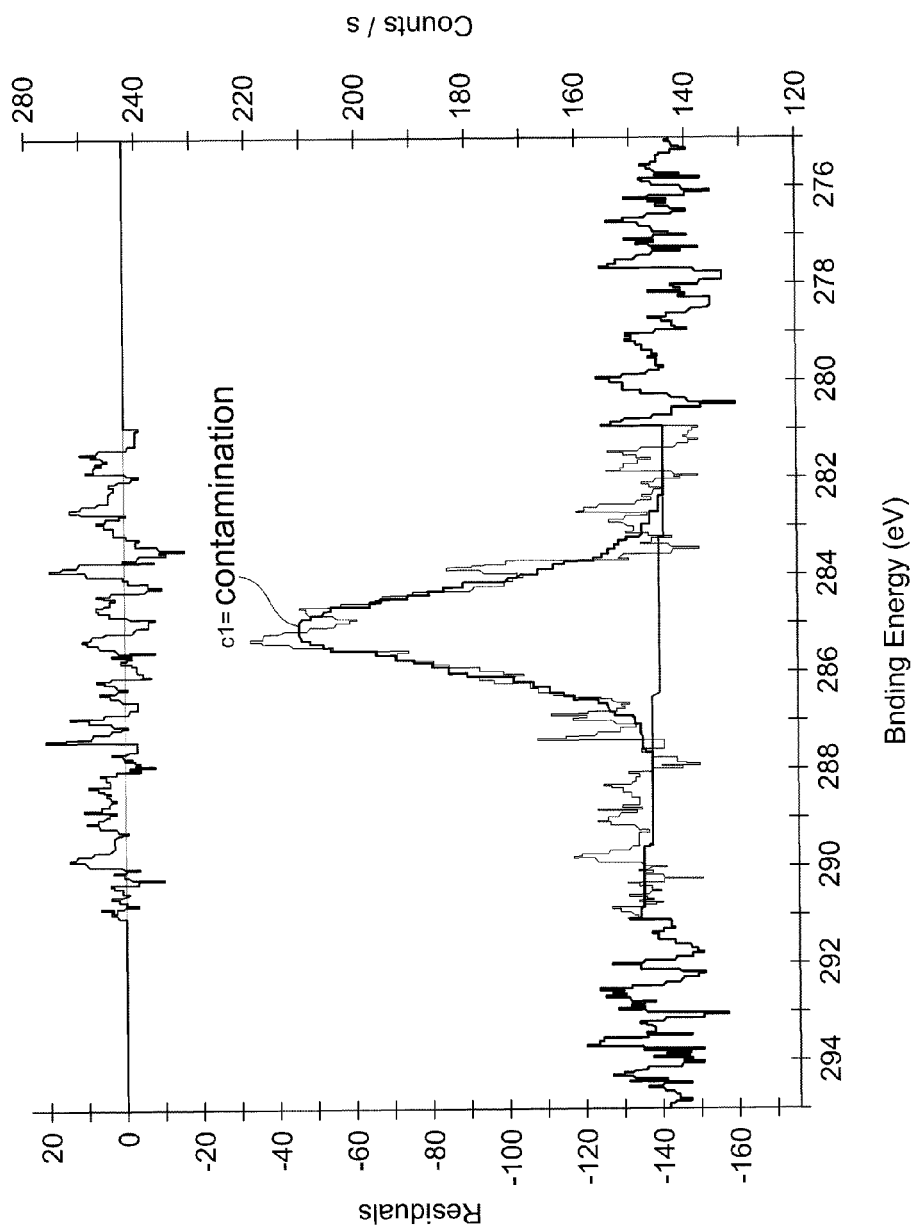

This peak is not present for samples which have not been grown using the predosing method, as can be seen on the graphs of FIG. 10 (FIG. 10a: with predosing, FIG. 10b: without predosing).

XPS also reveals a reduction of the nitridation of the Si substrate prior to AlN growth, which is in agreement with the TEM results obtained for AlN layer grown of Si without predosing.

All references cited herein, including but not limited to published and unpublished applications, patents, and literature references, are incorporated herein by reference in their entirety and are hereby made a part of this specification. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification are to be understood as being modified in all instances by the term "about." Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention.

What is claimed is:

1. A semiconductor structure comprising:
   a silicon substrate;
   an intermediate layer on the silicon substrate, the intermediate layer comprising at least one area consisting of a silicon carbide layer throughout a thickness of the area, the area having a thickness of 2 nm or less; and
   a group III nitride layer on the intermediate layer, wherein the group III nitride layer or the silicon carbide layer has a value of full width at half maximum lower than about 1000 arc sec.

2. The structure according to claim 1, wherein said intermediate layer is a silicon carbide layer.

3. The structure according to claim 1, wherein the silicon carbide area has a thickness of 1 nm or less.

4. The structure according to claim 1, wherein the silicon carbide area is an atomic monolayer of silicon carbide.

5. A semiconductor structure comprising:
   a silicon substrate;
   an intermediate layer on the silicon substrate, the intermediate layer comprising at least one area consisting of a silicon carbide layer throughout a thickness of the area, the area having a thickness of 2 nm or less; and
   a group III nitride layer on the intermediate layer, wherein the group III nitride is selected from the group consisting of AlN, GaN, AlGaN, InGaN, and AlInGaN, and wherein the group III nitride layer or the silicon carbide layer has a value of full width at half maximum lower than about 1000 arc sec.

6. A semiconductor structure comprising:
   a silicon substrate;
   an intermediate layer on the silicon substrate, the intermediate layer comprising at least one area consisting of a silicon carbide layer throughout a thickness of the area the area having a thickness of 2 nm or less;
   a group III nitride layer on the intermediate layer, wherein the group III nitride layer or the silicon carbide layer has a value of full width at half maximum lower than about 1000 arc sec; and
   a further group III nitride layer on the group III nitride layer.

7. The structure according to claim 6, wherein the further group III nitride is selected from the group consisting of AlN, GaN, AlGaN, InGaN, and AlInGaN.

8. The structure according to claim 1, wherein the group III nitride layer has a film thickness of less than 10 μm.

9. A semiconductor device comprising the semiconductor structure according to claim 1.

10. A semiconductor device comprising the semiconductor structure according to claim 5.

11. A semiconductor device comprising the semiconductor structure according to claim 6.

* * * * *

UNITED STATES PATENT AND TRADEMARK OFFICE
CERTIFICATE OF CORRECTION

PATENT NO. : 7,989,925 B2  
APPLICATION NO. : 12/502940  
DATED : August 2, 2011  
INVENTOR(S) : Cheng et al.

Page 1 of 1

It is certified that error appears in the above-identified patent and that said Letters Patent is hereby corrected as shown below:

| Issued Patent | | Description of Discrepancy |
|---|---|---|
| Column | Line | |
| Page 1 (Item 75) Inventors | 3 | Change "(Scherpenheuven-Zichem BE) for Stefan Degroote" to --Scherpenheuvel-Zichem (BE)--. |
| Page 1 (Item 56) Col. 2 | 1 | Under Other Publications, change "AIN" to --AlN--. |
| Sheet 4 of 10 (FIG. 6) | 1 | Change "pre dosing" to --predosing--. |
| Sheet 9 of 10 (FIG. 10A) | 1 (Below X-axis) | Change "Bnding" to --Binding--. |
| Sheet 10 of 10 (FIG. 10B) | 1 (Below X-axis) | Change "Bnding" to --Binding--. |
| 3 | 10 | After "comprising" insert --:--. |
| 4 | 3 | Change "15 at" to --15%--. |
| 4 | 10 | Change "(a)" to --(a),--. |
| 5 | 61 | Change "not)" to --not),--. |
| 6 | 19 | Change "$Si_1C_1$." to --$Si_1C_1$.--. |
| 8 | 60 | After "comprises" insert --:--. |
| 9 | 2 | After "comprises" insert --:--. |
| 10 | 19 | Change "used)" to --used),--. |
| 10 | 62 | Change "mL," to --ML,--. |
| 12 | 28 | In Claim 6, change "area" to --area,--. |

Signed and Sealed this  
Fourteenth Day of February, 2012

David J. Kappos  
*Director of the United States Patent and Trademark Office*